United States Patent
Chiang

(10) Patent No.: US 8,059,440 B2
(45) Date of Patent: *Nov. 15, 2011

(54) CONTENT-ADDRESSABLE MEMORY

(75) Inventor: Ming-Cheng Chiang, Hsinchu (TW)

(73) Assignee: Realtek Semiconductor Corp., Hsinchu (TW)

(*) Notice: Subject to any disclaimer, the term of this patent is extended or adjusted under 35 U.S.C. 154(b) by 262 days.

This patent is subject to a terminal disclaimer.

(21) Appl. No.: 12/480,101

(22) Filed: Jun. 8, 2009

(65) Prior Publication Data

US 2009/0310395 A1 Dec. 17, 2009

(30) Foreign Application Priority Data

Jun. 11, 2008 (TW) ................................ 97121714 A

(51) Int. Cl.
*G11C 15/00* (2006.01)
*G11C 8/00* (2006.01)
(52) U.S. Cl. .................. 365/49.17; 365/154; 365/230.05
(58) Field of Classification Search ............... 365/49.17, 365/154, 230.05
See application file for complete search history.

(56) References Cited

U.S. PATENT DOCUMENTS

| | | | | |
|---|---|---|---|---|
| 6,618,280 B2* | 9/2003 | Takahashi et al. | ......... | 365/49.17 |
| 7,120,040 B2* | 10/2006 | Perry et al. | ................. | 365/49.11 |
| 7,298,635 B1* | 11/2007 | Maheshwari | ............... | 365/49.17 |
| 2005/0201132 A1* | 9/2005 | Shin et al. | ........................ | 365/49 |

OTHER PUBLICATIONS

Choi et al. "A 0.7-fJ/Bit/Search 2.2-ns Search Time Hybrid-Type TCAM Architecture." IEEE Journal of Solid-State Circuits. Jan. 2005. pages 254-260. vol. 40, No. 1.
Mohan et al. "Design Techniques and Test Methodology for Low-Power TCAMs." IEEE Transactions on Very Large Scale Integration (VLSI) Systems. Jun. 2006; pp. 573-586. vol. 14, No. 6.
Pagiamtzis et al. "Content-Addressable Memory (CAM) Circuits and Architectures: A Tutorial and Survey." IEEE Journal of Solid-State Circuits. Mar. 2006. pages 712-727. vol. 41, No. 3.

* cited by examiner

*Primary Examiner* — Anh Phung
(74) *Attorney, Agent, or Firm* — The Webb Law Firm

(57) ABSTRACT

A content-addressable memory (CAM) comprises a first CAM cell and a second CAM cell. The first CAM cell stores a first data bit, and compares the first data bit with a first search bit to determine if they are matched. The second CAM cell stores a second data bit, and compares the second data bit with a second search bit to determine if they are matched. The first CAM cell comprises a first logic circuit, the second CAM cell comprises a second logic circuit, and the first logic circuit and the second logic circuit form a static CMOS logic circuit.

12 Claims, 5 Drawing Sheets

US 8,059,440 B2

CONTENT-ADDRESSABLE MEMORY

CROSS-REFERENCE TO RELATED APPLICATION

This application claims priority of Taiwanese Application No. 097121714, filed on Jun. 11, 2008.

BACKGROUND OF THE INVENTION

1. Field of the Invention

The present invention relates to a content-addressable memory (CAM), more particularly to a CAM that does not require precharging and has a low power consumption.

2. Description of the Related Art

A CAM comprises a plurality of CAM cells arranged in an array. Content stored in each row of the array is compared with search data to determine if there is a match, and a plurality of matching bits corresponding respectively to the rows are generated in accordance with the results of such a comparison.

Depending on the number of states that can be stored by the CAM cells, a CAM is classified as a binary CAM or a ternary CAM.

In the case of the binary CAM, each CAM cell comprises a data memory cell and a comparison circuit. The data memory cell stores a data bit and a complementary data bit to represent one of either a "0" or "1" state.

In the case of the ternary CAM, each CAM cell comprises a data memory cell, a mask memory cell, and a comparison circuit. The data memory cell stores a data bit and a complementary data bit, and the mask memory cell stores a mask bit and a complementary mask bit. Each of the bits of the data memory cell and the mask memory cell may represent a "0," "1," or "don't care" state.

For both the binary CAM and the ternary CAM, precharging is required at each comparison cycle with respect to an input terminal of a search bit, an input terminal of a complementary search bit, and an output terminal of a matching bit. As a result, overall efficiency is reduced and power consumption is increased.

SUMMARY OF THE INVENTION

Therefore, an object of this invention is to provide a content-addressable memory (CAM) having a high operating speed and a low power consumption.

According to this invention, a content-addressable memory (CAM) comprises: a first CAM cell comprising a first data memory cell which stores a first data bit, and a first comparison circuit coupled to the first data memory cell, and which compares the first data bit with a first search bit to determine if the first data bit matches the first search bit; and a second CAM cell comprising a second data memory cell which stores a second data bit, and a second comparison circuit coupled to the second data memory cell, and which compares the second data bit with a second search bit to determine if the second data bit matches the second search bit.

The first comparison circuit comprises a first logic circuit, and the second comparison circuit comprises a second logic circuit. The first logic circuit and the second logic circuit form a static complementary metal-oxide-semiconductor (COOS) logic circuit.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
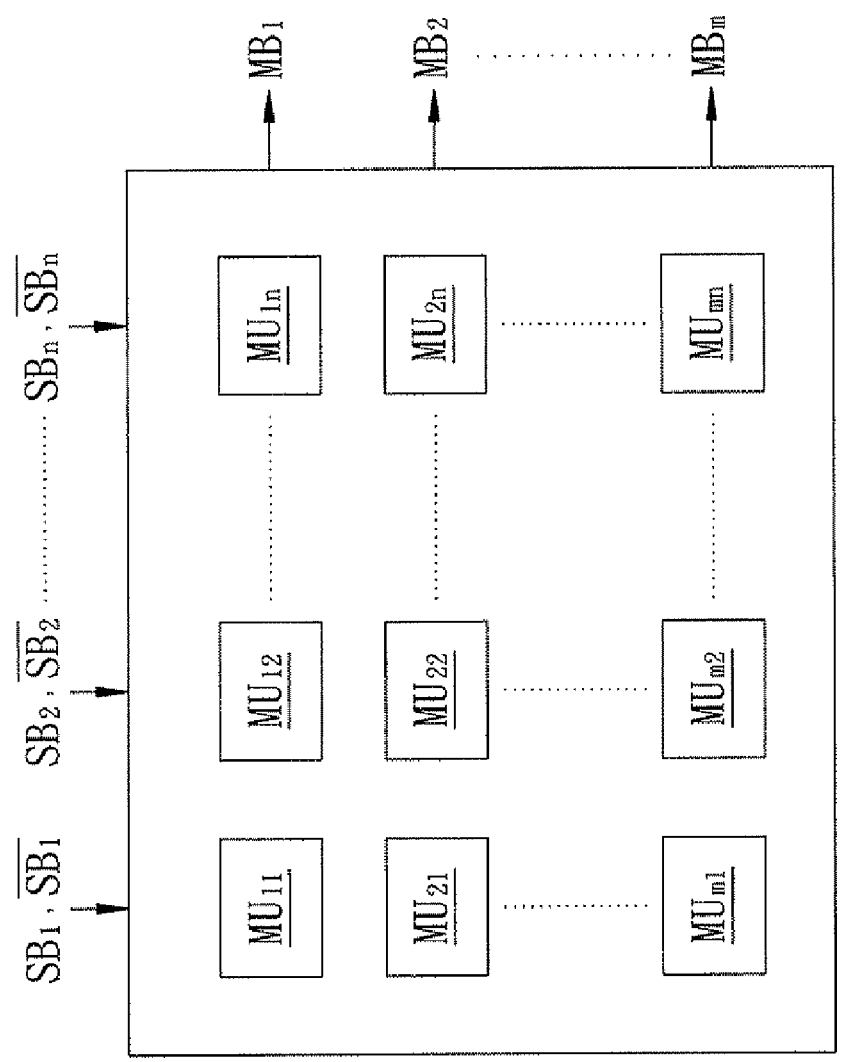
FIG. 1 is a simplified block diagram of a content-addressable memory of the present invention.

Before the present invention is described in greater detail, it should be noted that like elements are denoted by the same reference numerals throughout the disclosure.

Referring to FIG. 1, a content-addressable memory (CAM) according to the present invention receives an n-number of search bits $SB_j$ and an n-number of complementary search bits $\overline{SB_j}$, outputs an m-number of matching bits $MB_i$, and comprises an (m×n)-number of CAM cells $MU_{ij}$, where $i=1\sim m$ and $j=1\sim n$.

Figure 2:
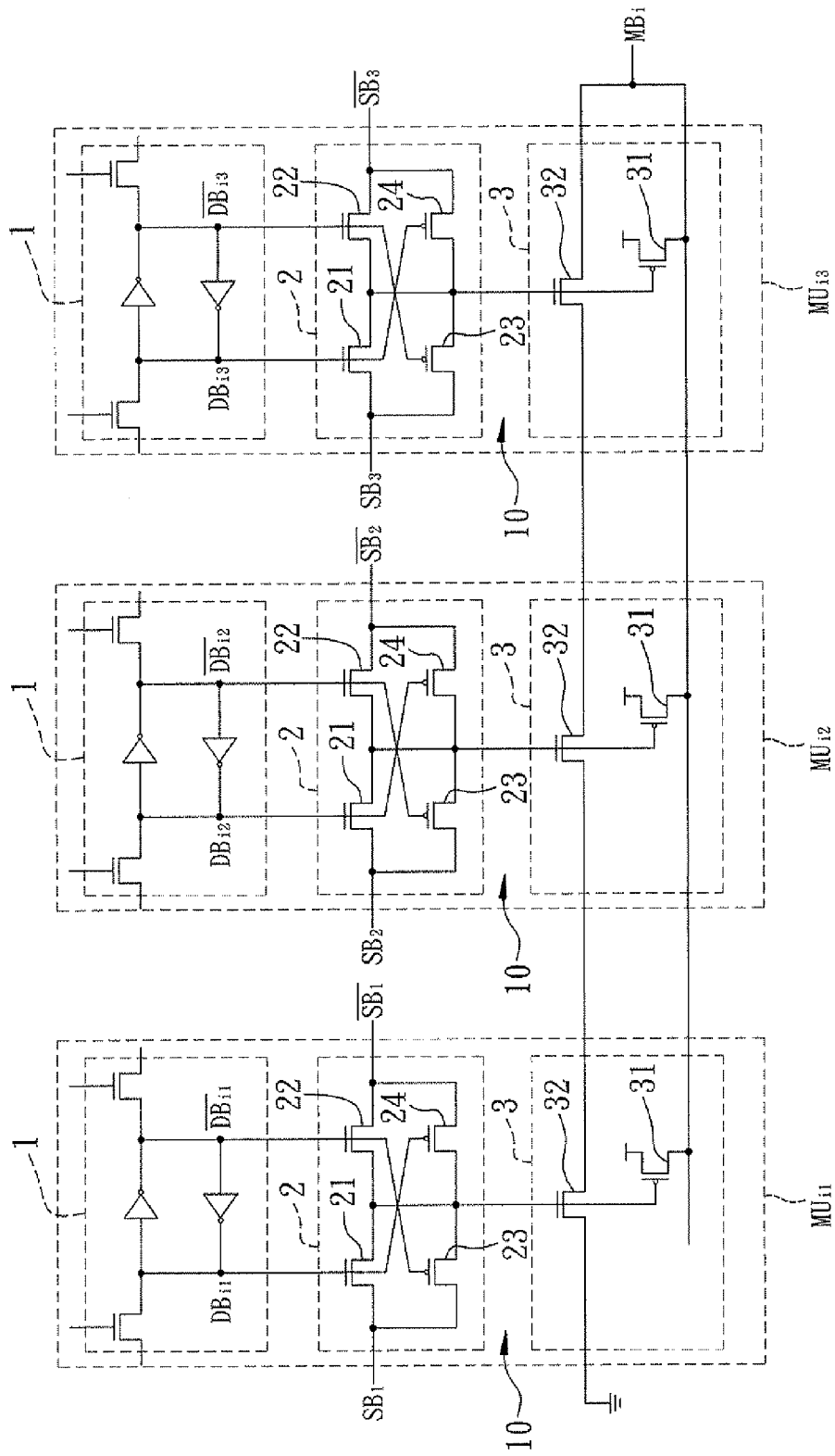
FIG. 2 is a schematic circuit diagram of a content-addressable memory according to a first preferred embodiment of the present invention.

FIG. 2 is a schematic circuit diagram of a CAM according to a first preferred embodiment of the present invention. The CAM of the first preferred embodiment is a binary CAM, and the example shown in FIG. 2 is that in which n=3. The n-number of CAM cells $MU_{ij}$ located on an $i^{th}$ row respectively receive an n-number of search bits $SB_j$ and an n-number of complementary search bits $\overline{SB_j}$. Each of the CAM cells $MU_{ij}$ comprises a data memory cell 1 and a comparison circuit 10. The comparison circuit 10 of each of the CAM cells $MU_{ij}$ comprises a logic circuit 2 and a logic circuit 3. For each of the CAM cells $MU_{ij}$: the data memory cell 1 stores a data bit $DB_{ij}$ and a complementary data bit $\overline{DB_{ij}}$; the logic circuit 2 compares the data bit $DB_{ij}$ and the complementary data bit $\overline{DB_{ij}}$ stored in the data memory cell 1 respectively with a search bit $SB_j$ and a complementary search bit $\overline{SB_j}$ to determine if there is a match, and outputs a comparison result to the logic circuit 3; and the logic circuit 3 comprises a transistor 31 and a transistor 32 which are controlled by the comparison result and which are complementary to each other. When the comparison result indicates a match, the transistor 31 does not conduct while the transistor 32 does conduct, and when the comparison result indicates that there is not a match, the transistor 31 conducts while the transistor 32 does not conduct. The logic circuits 3 of the n-number of CAM cells $MU_{ij}$ of the $i^{th}$ row together form a static complementary metal-oxide-semiconductor (CMOS) logic circuit.

In the first preferred embodiment, for the n-number of CAM cells $MU_{ij}$ of the $i^{th}$ row: the transistors 31 are p-channel metal-oxide-semiconductor field-effect transistors (PMOS transistors), and are connected in parallel between an input terminal of an operating voltage and an output terminal of a corresponding matching bit $MB_i$; and the transistors 32 are n-channel metal-oxide-semiconductor field-effect transistors (NMOS transistors), and are connected in series between an input terminal of a ground voltage and the output terminal of the matching bit $MB_i$. Therefore, the logic circuits 3 together form a complementary NAND gate having an n-number of input terminals and an output terminal. As a result of such a configuration, it is unnecessary to perform precharging with respect to the input terminals of the search bits $SB_j$, the input terminals of the complementary search bits $\overline{SB_j}$, and the output terminal of the matching bit $MB_i$, and there is no static current, such that operating speed is increased and power consumption is reduced.

In the first preferred embodiment, for each of the CAM cells $MU_{ij}$, the logic circuit 2 comprises four transistors 21-24, in which the transistors 21, 22 are NMOS transistors and the transistors 23, 24 are PMOS transistors. The transistors 21, 23 are controlled respectively by a data bit $DB_{ij}$ and a complementary data bit $\overline{DB_{ij}}$, and are connected in parallel between the input terminal of the corresponding search bit $SB_j$ and the output terminal of the comparison result. The transistors 22, 24 are controlled respectively by the complementary data bit $\overline{DB_{ij}}$ and the data bit $DB_{ij}$, and are connected in parallel between the input terminal of the corresponding complementary search bit $\overline{SB_j}$ and the output terminal of the comparison result.

A more detailed explanation of the operating principles of the first preferred embodiment will now be described. For each of the CAM cells $MU_{ij}$, when the data bit $DB_{ij}$ and the complementary data bit $\overline{DB_{ij}}$ stored in the data memory cell 1 thereof match respectively the corresponding search bit $SB_j$ and the complementary search bit $\overline{SB_j}$ (for example, $\{DB_{ij}, \overline{DB_{ij}}, SB_j, \overline{SB_j}\}$ are $\{0,1,0,1\}$ or $\{1,0,1,0\}$), the comparison result output by the logic circuit 2 is 1, such that the transistor 31 does not conduct while the transistor 32 does conduct. On the other hand, when the data bit $DB_{ij}$ and the complementary data bit $\overline{DB_{ij}}$ stored in the data memory cell 1 thereof do not match respectively the corresponding search bit $SB_j$ and the complementary search bit $\overline{SB_j}$ (for example, $\{DB_{ij}, \overline{DB_{ij}}, SB_j, \overline{SB_j}\}$ are $\{0,1,1,0\}$ or $\{1,0,0,1\}$), the comparison result output by the logic circuit 2 is 0, such that the transistor 31 conducts while the transistor 32 does not conduct. For the n-number of CAM cells $MU_{ij}$ of the $i^{th}$ row, when the comparison results output by the logic circuits 2 are all 1, the logic value of the matching bit $MB_i$ is 0, indicating that there is a match with respect to the $i^{th}$ row. However, if at least one of the comparison results output by the logic circuits 2 is 0, the logic value of the matching bit $MB_i$ is 1, indicating that there is not a match with respect to the $i^{th}$ row.

Figure 3:
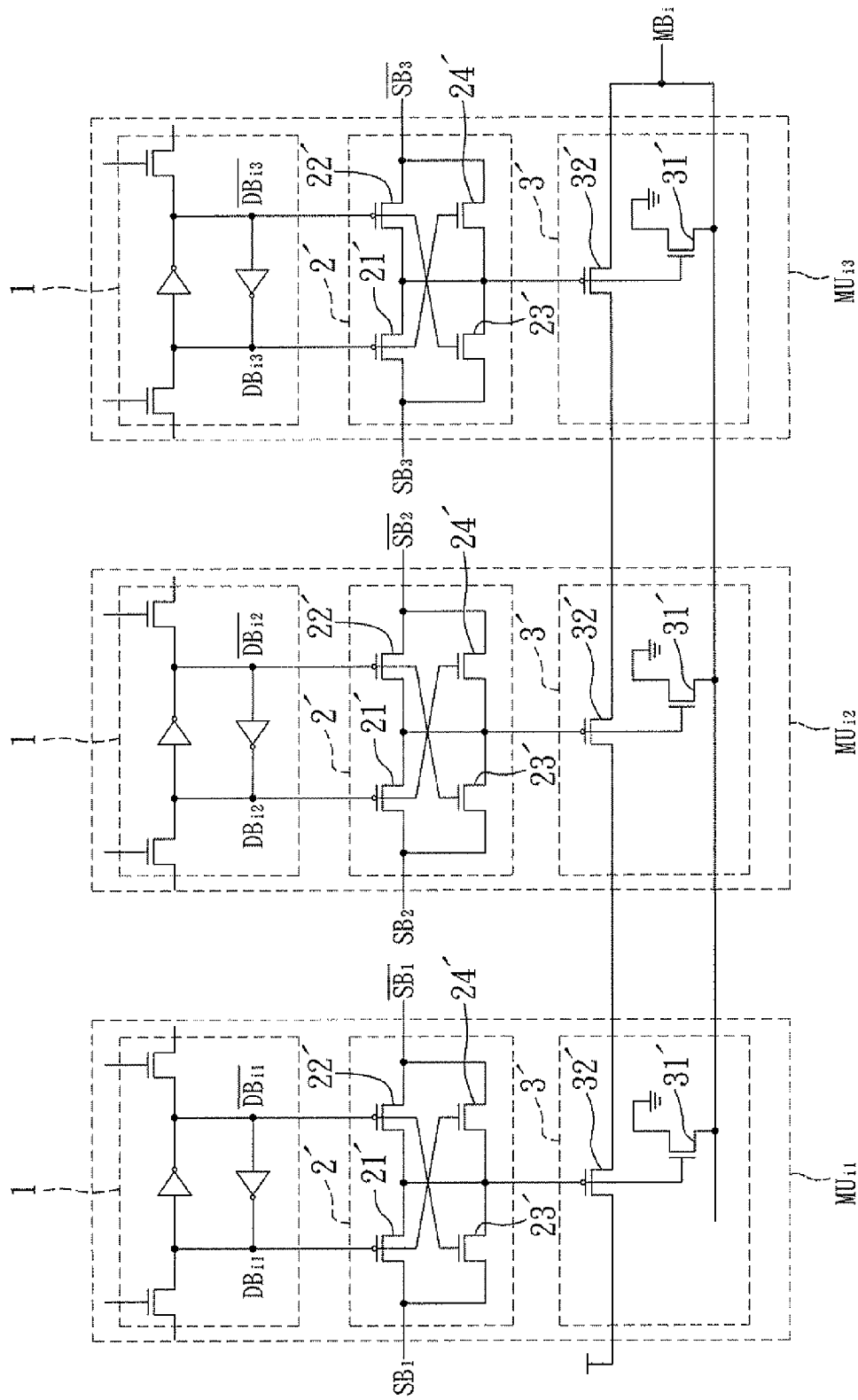
FIG. 3 is a schematic circuit diagram of a content-addressable memory according to a second preferred embodiment of the present invention.

FIG. 3 is a schematic circuit diagram of a CAM according to a second preferred embodiment of the present invention. The CAM of the second preferred embodiment is similar to that of the first preferred embodiment but differs therefrom with respect to the logic circuits 2' and the logic circuits 3'. In the second preferred embodiment, for the n-number of CAM cells $MU_{ij}$ of the $i^{th}$ row, the transistors 23', 24', 31' are NMOS transistors, the transistors 21', 22', 32' are PMOS transistors, the transistors 31' are connected in parallel between the input terminals of the ground voltage and the output terminal of the matching bit $MB_i$, and the transistors 32' are connected in series between the input terminals of the operating voltage and the output terminal of the matching bit $MB_i$. Therefore, the logic circuits 3' together form a complementary NOR gate having an n-number of input terminals and an output terminal. As a result, it is unnecessary to perform precharging with respect to the input terminals of the search bits $SB_j$, the input terminals of the complementary search bits $\overline{SB_j}$, and the output terminal of the matching bit $MB_i$, and there is no static current, such that operating speed is increased and power consumption is reduced. Since the operating principles of the second preferred embodiment may be ascertained from the explanation of the operating principles of the first preferred embodiment provided above, a description thereof will not be provided herein.

Figure 4:
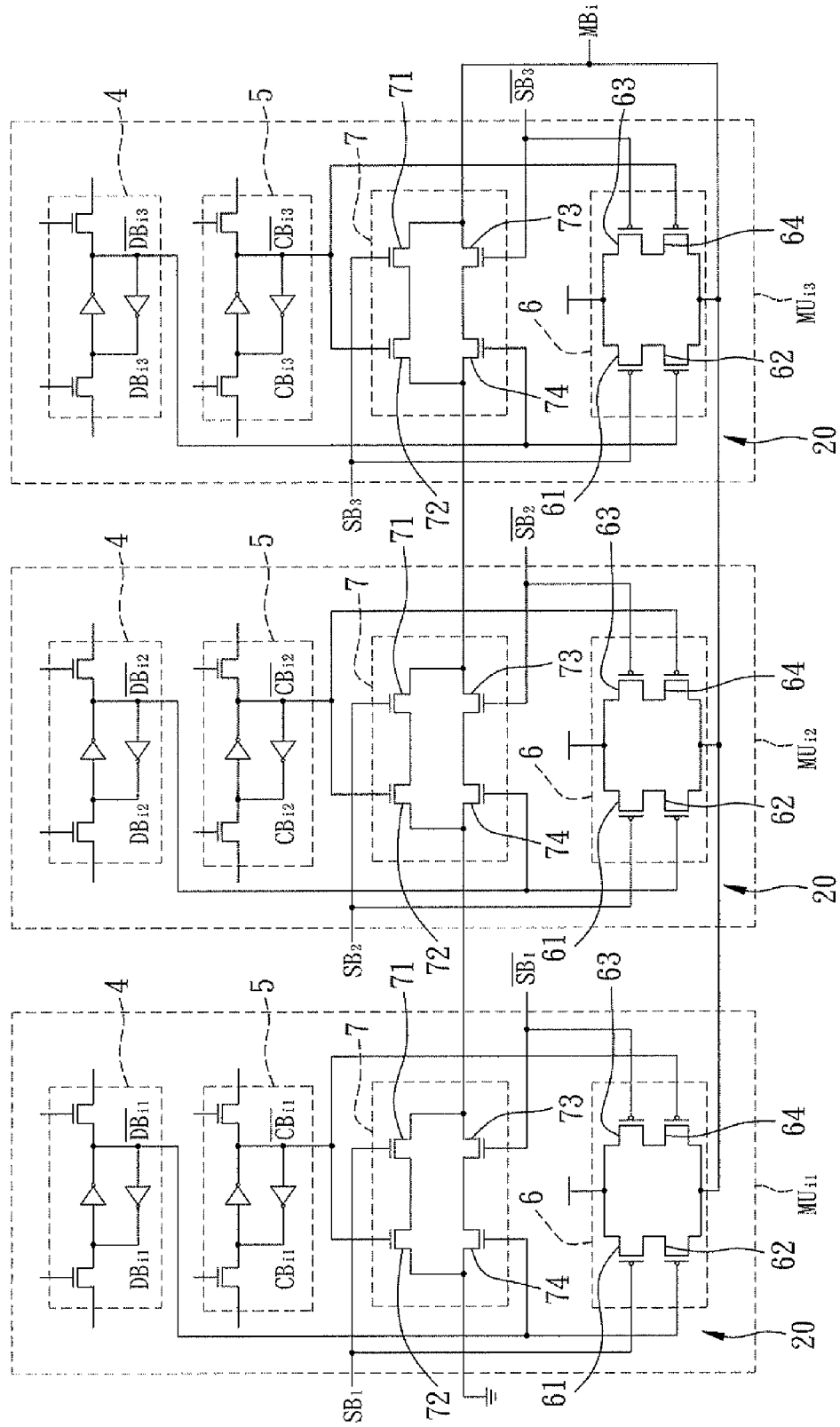
FIG. 4 is a schematic circuit diagram of a content-addressable memory according to a third preferred embodiment of the present invention.

FIG. 4 is a schematic circuit diagram of a CAM according to a third preferred embodiment of the present invention. The CAM of the third preferred embodiment is a ternary CAM, and the example shown in FIG. 4 is that in which n=3. The n-number of CAM cells $MU_{ij}$ of the $i^{th}$ row respectively receive an n-number of search bits $SB_j$ and an n-number of complementary search bits $\overline{SB_j}$. Each of the CAM cells $MU_{ij}$ comprises a data memory cell 4, a mask memory cell 5, and a comparison circuit 20, in which the comparison circuit 20 comprises a logic circuit 6 and a logic circuit 7. For each of the CAM cells $MU_{ij}$: the data memory cell 4 stores a data bit $DB_{ij}$ and a complementary data bit $\overline{DB_{ij}}$; the mask memory cell 5 stores a mask bit $CB_{ij}$ and a complementary mask bit $\overline{CB_{ij}}$; and the logic circuit 6 and the logic circuit 7 are used to compare states represented by the data bits $DB_{ij}$, $\overline{DB_{ij}}$ stored in the data memory cell 4 and the mask bits $CB_{ij}$, $\overline{CB_{ij}}$ stored in the mask memory cell 5 with a corresponding search bit $SB_j$ and a corresponding complementary search bit $\overline{SB_j}$ to determine if there is a match between the states and the search bits $SB_j$, $\overline{SB_j}$. Conducting states of the logic circuit 6 and the logic circuit 7 vary, depending on the result of such comparisons. In particular, when there is a match between such states and the search bits $SB_j$, $\overline{SB_j}$, the logic circuit 6 does not conduct while the logic circuit 7 does conduct, and when there is not a match between such states and the search bits $SB_j$, $\overline{SB_j}$, the logic circuit 6 conducts while the logic circuit 7 does not conduct. In addition, as is evident from FIG. 4, the logic circuits 6 and the logic circuits 7 of the n-number of CAM cells $MU_{ij}$ of the $i^{th}$ row together form a static CMOS logic circuit.

The following table illustrates how the matching states vary for each of the CAM cells $MU_{ij}$ in the third preferred embodiment depending on the logic values of the data bit $DB_{ij}$ and the mask bit $CB_{ij}$.

| $DB_{ij}$ | $CB_{ij}$ | Status | Matching state |
|---|---|---|---|
| 0 | 0 | Don't care | Definite match |
| 0 | 1 | 0 | Depends on $SB_j$ |
| 1 | 0 | 1 | Depends on $SB_j$ |
| 1 | 1 | Invalid | Definite non-match |

For the n-number of CAM cells $MU_{ij}$ of the $i^{th}$ row, the logic circuits 6 are connected in parallel between the input terminals of the operating voltage and the output terminal of the matching bit $MB_i$, and the logic circuits 7 are connected in series between the input terminals of the ground voltage and the output terminal of the matching bit $MB_i$. Therefore, the logic circuits 6 and the logic circuits 7 together form a circuit resembling a complementary NAND gate. As a result, it is unnecessary to perform precharging with respect to the input terminals of the search bits $SB_j$, the input terminals of the complementary search bits $\overline{SB_j}$, and the output terminal of the matching bit $MB_i$, and there is no static current, such that operating speed is increased and power consumption is reduced.

In the third preferred embodiment, for each of the CAM cells $MU_{ij}$, the logic circuit 6 comprises four transistors 61-64, and the logic circuit 7 comprises four transistors 71-74. The transistors 61-64 are PMOS transistors, and are controlled respectively by the corresponding search bit $SB_j$, the complementary data bit $\overline{DB_{ij}}$, the corresponding complementary search bit $\overline{SB_j}$, and the complementary mask bit $\overline{CB_{ij}}$. The transistor 61 and the transistor 62 are connected in series. The transistor 63 and the transistor 64 are connected in series, and are connected in parallel with the transistor 61 and the transistor 62. The transistors 71-74 are NMOS transistors, and are controlled respectively by the corresponding search bit $SB_j$, the complementary mask bit $\overline{CB_{ij}}$, the corresponding complementary search bit $\overline{SB_j}$, and the complementary data bit $\overline{DB_{ij}}$. The transistor 71 and the transistor 72 are connected in series. The transistor 73 and the transistor 74 are connected in series, and are connected in parallel with the transistor 71 and the transistor 72.

A detailed explanation of the operating principles of the third preferred embodiment will now be described. With respect to each of the CAN cells $MU_{ij}$, when states represented by the data bit $DB_{ij}$ and the complementary data bit $\overline{DB_{ij}}$ stored in the data memory cell 4, and the mask bit $CB_{ij}$ and the complementary mask bit $\overline{CB_{ij}}$ stored in the mask memory cell 5 match the corresponding search bit $SB_j$ and the complementary search bit $\overline{SB_j}$ (for example, $\{DB_{ij}, \overline{DB_{ij}}, CB_{ij}, \overline{CB_{ij}}, SB_j, \overline{SB_j}\}$ are $\{0,1,1,0,0,1\}$, $\{1,0,0,1,1,0\}$, $\{0,1,0,1,0,1\}$, or $\{0,1,0,1,1,0\}$), the transistor 61 and the transistor 62 are not able to simultaneously conduct, and the transistor 63 and the transistor 64 are not able to simultaneously conduct, such that the logic circuit 6 does not conduct, while the transistor 71 and the transistor 72 are able to simultaneously conduct, or the transistor 73 and the transistor 74 are able to simultaneously conduct, such that the logic circuit 7 conducts. On the other hand, when states represented by the data bit $DB_{ij}$ and the complementary data bit $\overline{DB_{ij}}$ stored in the data memory cell 4, and the mask bit $CB_{ij}$ and the complementary mask bit $\overline{CB_{ij}}$ stored in the mask memory cell 5 do not match the corresponding search bit $SB_j$ and the complementary search bit $\overline{SB_j}$ (for example, $\{DB_{ij}, \overline{DB_{ij}}, CB_{ij}, \overline{CB_{ij}}, SB_j, \overline{SB_j}\}$ are $\{0,1,1,0,1,0\}$, $\{1,0,0,1,0,1\}$, $\{1,0,1,0,0,1\}$, or $\{1,0,1,0,1,0\}$), the transistor 61 and the transistor 62 are able to simultaneously conduct, or the transistor 63 and the transistor 64 are able to simultaneously conduct, such that the logic circuit 6 conducts, while the transistor 71 and the transistor 72 are not able to simultaneously conduct, and the transistor 73 and the transistor 74 are not able to simultaneously conduct, such that the logic circuit 7 does not conduct. For the n-number of CAM cells $MU_{ij}$ of the $i^{th}$ row, when the logic circuits 6 all do not conduct, and the logic circuits 7 all conduct, the corresponding matching bit $MB_i$ is 0, indicating that there is a match with respect to the $i^{th}$ row, and when at least one of the logic circuits 6 conducts and at least one of the logic circuits 7 does not conduct, the corresponding matching bit $MB_i$ is 1, indicating that there is not a match with respect to the $i^{th}$ row.

Figure 5:
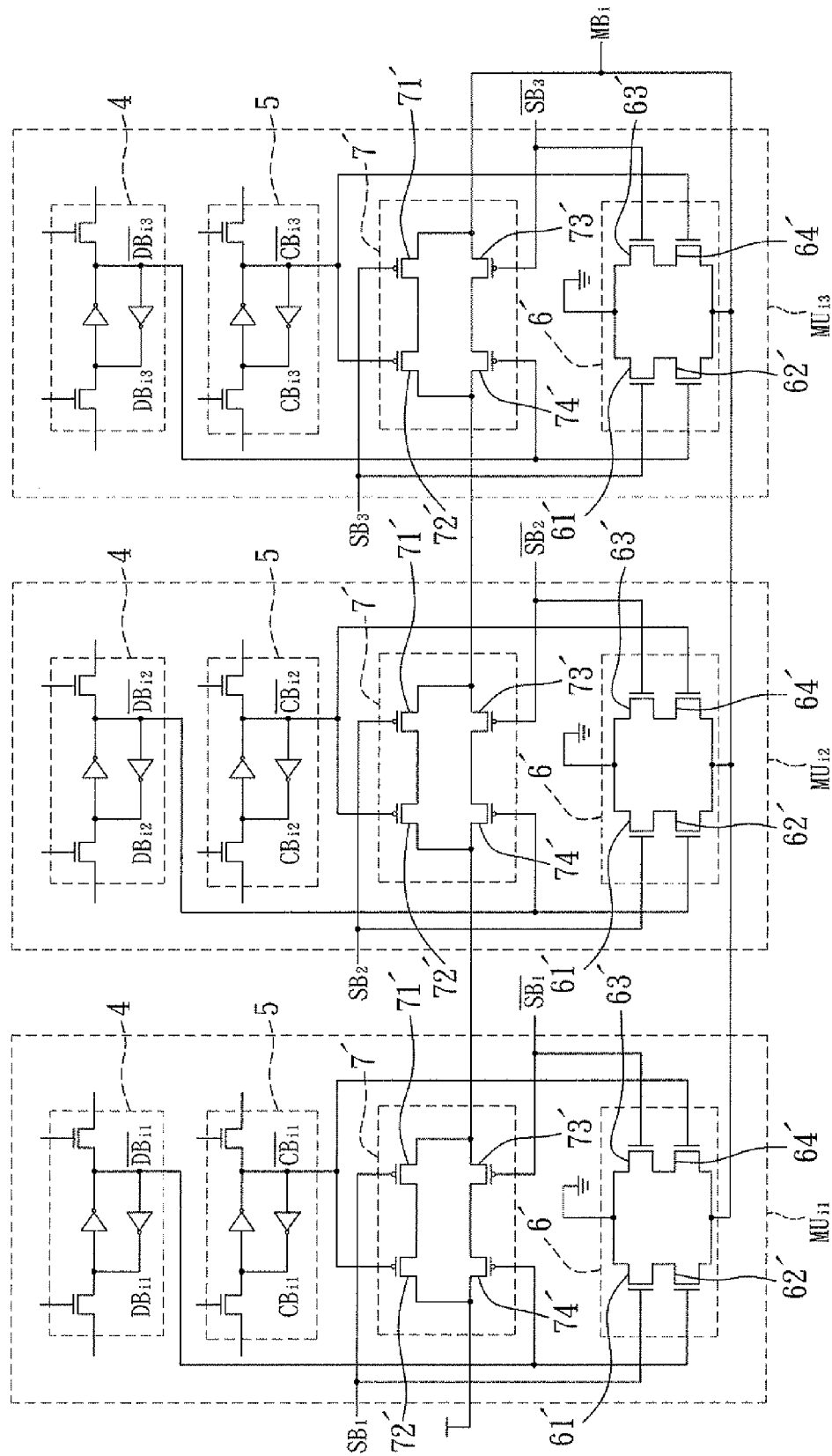
FIG. 5 is a schematic circuit diagram of a content-addressable memory according to a fourth preferred embodiment of the present invention.

FIG. 5 is a schematic circuit diagram of a CAM according to a fourth preferred embodiment of the present invention. The fourth preferred embodiment is similar to the third preferred embodiment, but differs with respect to the matching states resulting from the logic values of the data bit $DB_{ij}$ and the mask bit $CB_{ij}$, the logic circuits 6' and the logic circuits 7'. The following table illustrates how the matching states vary for each of the CAM cells $MU_{ij}$ in the fourth preferred embodiment depending on the logic values of the data bit $DB_{ij}$ and the mask bit $CB_{ij}$.

| $DB_{ij}$ | $CB_{ij}$ | Status | Match state |
|---|---|---|---|
| 0 | 0 | Invalid | Definite non-match |
| 0 | 1 | 0 | Depends on $SB_j$ |
| 1 | 0 | 1 | Depends on $SB_j$ |
| 1 | 1 | Don't care | Definite match |

For the n-number of CAM cells $MU_{ij}$ of the $i^{th}$ row, the transistors 61'-64' are NMOS transistors, the transistors 71'-74' are PMOS transistors, the logic circuits 6' are connected in parallel between the input terminals of the ground voltage and the output terminal of the matching bit $MB_i$, and the logic circuits 7' are connected in series between the input terminals of the operating voltage and the output terminal of the matching bit $MB_i$. Therefore, the logic circuits 6' and the logic circuits 7' together form a circuit resembling a complementary NOR gate. As a result, it is unnecessary to perform precharging with respect to the input terminals of the search bits $SB_j$, the input terminals of the complementary search bits $\overline{SB_j}$, and the output terminal of the matching bit $MB_i$, and there is no static current, such that operating speed is increased and power consumption is reduced. Since the operating principles of the fourth preferred embodiment may be ascertained from the explanation of the operating principles of the third preferred embodiment, a description thereof will not be provided herein.

It is to be noted that in the above embodiments, the data memory cells 1, 4 and the mask memory cells 5 are static random access memory (SRAM) cells. However, the present invention is not limited in this regard, and the data memory cells 1, 4 and the mask memory cells 5 may be memory cells based on other memory configurations.

In the present invention described above, the logic circuits 3, 3' are coupled to form a static CMOS logic circuit, or the logic circuits 6, 6' and the logic circuits 7, 7' are coupled to form a static CMOS logic circuit, such that it is unnecessary to perform precharging and there is no static current. Hence, operating speed is increased and power consumption is reduced.

With this invention thus explained, it is apparent that numerous modifications and variations can be made without departing from the scope and spirit of this invention. It is therefore intended that this invention be limited only as indicated by the appended claims.

What is claimed is:

1. A content-addressable memory (CAM) comprising:
a first CAM cell comprising:
  a first data memory cell for storing a first data bit, and
  a first comparison circuit coupled to said first data memory cell, for comparing the first data bit with a first search bit to determine if the first data bit matches the first search bit;
and
a second CAM cell comprising:
  a second data memory cell for storing a second data bit, and
  a second comparison circuit coupled to said second data memory cell, for comparing the second data bit with a second search bit to determine if the second data bit matches the second search bit;

wherein said first comparison circuit comprises a first logic circuit, said second comparison circuit comprises a second logic circuit; and said first logic circuit and said second logic circuit form a static complementary metal-oxide-semiconductor (CMOS) logic circuit.

2. The CAM of claim 1, wherein said first logic circuit comprises a first n-channel metal-oxide-semiconductor field-effect transistor (NMOS transistor) and a first p-channel metal-oxide-semiconductor field-effect transistor (PMOS transistor); said second logic circuit comprises a second NMOS transistor and a second PMOS transistor; said first NMOS transistor and said second NMOS transistor are coupled in series; and said first PMOS transistor and said second PMOS transistor are coupled in parallel.

3. The CAM of claim 1, wherein said first logic circuit comprises a first NMOS transistor and a first PMOS transistor; said second logic circuit comprises a second NMOS transistor and a second PMOS transistor; said first NMOS transistor and said second NMOS transistor are coupled in parallel; and said first PMOS transistor and said second PMOS transistor are coupled in series.

4. The CAM of claim 1, wherein said first comparison circuit generates a first comparison result on the basis of the determination performed thereby; said second comparison circuit generates a second comparison result on the basis of the determination performed thereby; and each of said first logic circuit and said second logic circuit outputs a matching bit in accordance with a respective one of the first comparison result and the second comparison result.

5. The CAM of claim 1, wherein said first data memory cell further stores a first complementary data bit; said first logic circuit comprises a first NMOS transistor and a first PMOS transistor; said first comparison circuit generates a first comparison result on the basis of the determination performed thereby and transmits the first comparison result to said first NMOS transistor and said first PMOS transistor; and said first comparison circuit further comprises:
a second NMOS transistor and a second PMOS transistor controlled respectively by the first data bit and the first complementary data bit, and coupled in parallel between an input terminal of the first search bit and an output terminal of the first comparison result, and
a third NMOS transistor and a third PMOS transistor controlled respectively by the first complementary data bit and the first data bit, and coupled in parallel between the input terminal of the first search bit and the output terminal of the first comparison result.

6. The CAM of claim 1, wherein said first data memory cell further stores a first complementary data bit; said first logic circuit comprises a first PMOS transistor and a first NMOS transistor; said first comparison circuit generates a first comparison result based on the determination performed thereby and transmits the first comparison result to said first NMOS transistor and said first PMOS transistor; and said first comparison circuit further comprises:
a second PMOS transistor and a second NMOS transistor controlled respectively by the first data bit and the first complementary data bit, and coupled in parallel between an input terminal of the first search bit and an output terminal of the first comparison result; and
a third PMOS transistor and a third NMOS transistor controlled respectively by the first complementary data bit and the first data bit, and coupled in parallel between the input terminal of the first search bit and the output terminal of the first comparison result.

7. The CAM of claim 1, wherein said CAM is a ternary CAM; and said first CAM cell further comprises a mask memory cell for storing a mask bit.

8. The CAM of claim 7, wherein said first comparison circuit is coupled to said mask memory cell, and compares a state represented by the first data bit and the mask bit with the first search bit to determine if the state represented by the first data bit and the mask bit matches the first search bit; said first comparison circuit comprises a third logic circuit; and said first logic circuit, said second logic circuit, and said third logic circuit form a static CMOS logic circuit.

9. The CAM of claim 8, wherein said first data memory cell further stores a first complementary data bit; said mask memory cell further stores a complementary mask bit; said first logic circuit comprises:
a first NMOS transistor coupled to said mask memory cell and controlled by the complementary mask bit;
a second NMOS transistor serially coupled to said first NMOS transistor and controlled by the first search bit;
a third NMOS transistor coupled to said first data memory cell and controlled by the first complementary data bit; and
a fourth NMOS transistor coupled in series to said third NMOS transistor and controlled by a first complementary search bit;
wherein said first and second NMOS transistors are coupled in parallel to said third and fourth NMOS transistors.

10. The CAM of claim 9, wherein said third logic circuit comprises:
a first PMOS transistor coupled to said mask memory cell and controlled by the complementary mask bit;
a second PMOS transistor serially coupled to said first PMOS transistor and controlled by the first complementary search bit;
a third PMOS transistor coupled to said first data memory cell and controlled by the first complementary data bit; and
a fourth PMOS transistor coupled in series to said third PMOS transistor and controlled by the first search bit;
wherein said first and second PMOS transistors are coupled in parallel to said third and fourth PMOS transistors.

11. The CAM of claim 8, wherein said first data memory cell further stores a first complementary data bit; said mask memory cell further stores a complementary mask bit; said first logic circuit comprises:
a first NMOS transistor coupled to said mask memory cell and controlled by the complementary mask bit;
a second NMOS transistor serially coupled to said first NMOS transistor and controlled by a first complementary search bit;
a third NMOS transistor coupled to said first data memory cell and controlled by the first complementary data bit; and
a fourth NMOS transistor coupled in series to said third NMOS transistor and controlled by the first search bit;
wherein said first and second NMOS transistors are coupled in parallel with said third and fourth NMOS transistors.

12. The CAM of claim 11, wherein said third logic circuit comprises:
a first PMOS transistor coupled to said mask memory cell and controlled by the complementary mask bit;
a second PMOS transistor serially coupled to said first PMOS transistor and controlled by the first search bit;

a third PMOS transistor coupled to said first data memory cell and controlled by the first complementary data bit; and a fourth PMOS transistor coupled in series to said third PMOS transistor and controlled by the first complementary search bit;

wherein said first and second PMOS transistors are connected in parallel with said third and fourth PMOS transistors.

* * * * *